United States Patent [19]

Terazono

[11] Patent Number: 5,640,026

[45] Date of Patent: Jun. 17, 1997

[54] COMPOUND SEMICONDUCTOR DEVICE INCLUDING IMPLANTED ISOLATION REGIONS

[75] Inventor: Shinichi Terazono, Itami, Japan

[73] Assignee: Mitsubishi Denki Kabushiki Kaisha, Tokyo, Japan

[21] Appl. No.: 584,234

[22] Filed: Jan. 11, 1996

Related U.S. Application Data

[62] Division of Ser. No. 153,160, Nov. 17, 1993, Pat. No. 5,508,210.

[30] Foreign Application Priority Data

Mar. 9, 1993 [JP] Japan ..................................... 5-047677

[51] Int. Cl.$^6$ ................. H01L 31/0328; H01L 31/0336; H01L 29/00
[52] U.S. Cl. ........................... 257/192; 257/194; 257/499
[58] Field of Search .................................... 257/192, 194, 257/197, 198, 506, 510, 519

[56] References Cited

U.S. PATENT DOCUMENTS

| | | | |
|---|---|---|---|
| 4,728,616 | 3/1988 | Ankri et al. | 437/22 |
| 5,010,381 | 4/1991 | Shiba | 357/30 |
| 5,086,004 | 2/1992 | Quintana | 437/22 |
| 5,185,274 | 2/1993 | Chang et al. | 437/22 |
| 5,254,492 | 10/1993 | Tserng et al. | 437/56 |
| 5,256,579 | 10/1993 | Lezec et al. | 437/22 |
| 5,302,840 | 4/1994 | Takikawa | 257/194 |

FOREIGN PATENT DOCUMENTS 62-274669  11/1987  Japan .

*Primary Examiner*—Wael Fahmy
*Attorney, Agent, or Firm*—Leydig, Voit & Mayer

[57] ABSTRACT

A method of performing element separation by ion implantation for a compound semiconductor device includes performing first ion implantation into the entire contour of the device periphery region to produce a first insulating region having a region of the maximum ion implantation concentration serving as an insulation destruction relaxing layer within a buffer layer located at the deepest position of epitaxial growth layers. Even when there is a distribution of implanted ions in the depth direction at the thermal processing in the wafer process, the implanted ions diffuse so that the concentration of ions is uniform in the depth direction and a thermally stable ion implantation concentration as well as stable device characteristics are obtained. A second insulating region having a resistance different from that of the first insulating region may be further produced by a second ion implantation at a position in the device periphery region, therefore electric field concentration at the interface between the insulating region and the gate metal is relaxed and a stable high gate junction breakdown voltage is secured. Thus, a highly reliable element separating technique and a highly reliable device are obtained.

8 Claims, 8 Drawing Sheets

COMPOUND SEMICONDUCTOR DEVICE INCLUDING IMPLANTED ISOLATION REGIONS

This disclosure is a division of patent application Ser. No. 08/153,160, filed Nov. 17, 1993 now U.S. Pat. No. 5,508,210.

FIELD OF THE INVENTION

The present invention relates to element separating method for compound semiconductor device and compound semiconductor device and, more particularly, to element isolating technique for a single or an integrated compound semiconductor device.

BACKGROUND OF THE INVENTION

Figure 8A:
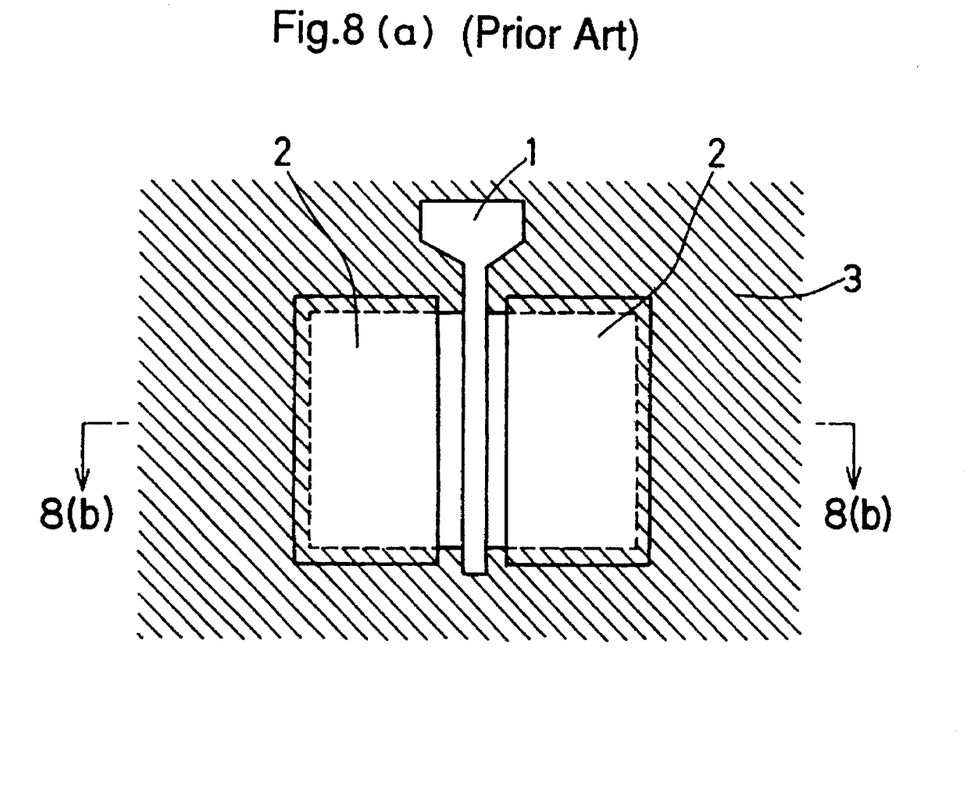
FIGS. 8(a) and 8(b) are respectively a plan view and a cross-sectional view illustrating a layer structure of a GaAs system MESFET in accordance with a prior art.
Figure 8B:
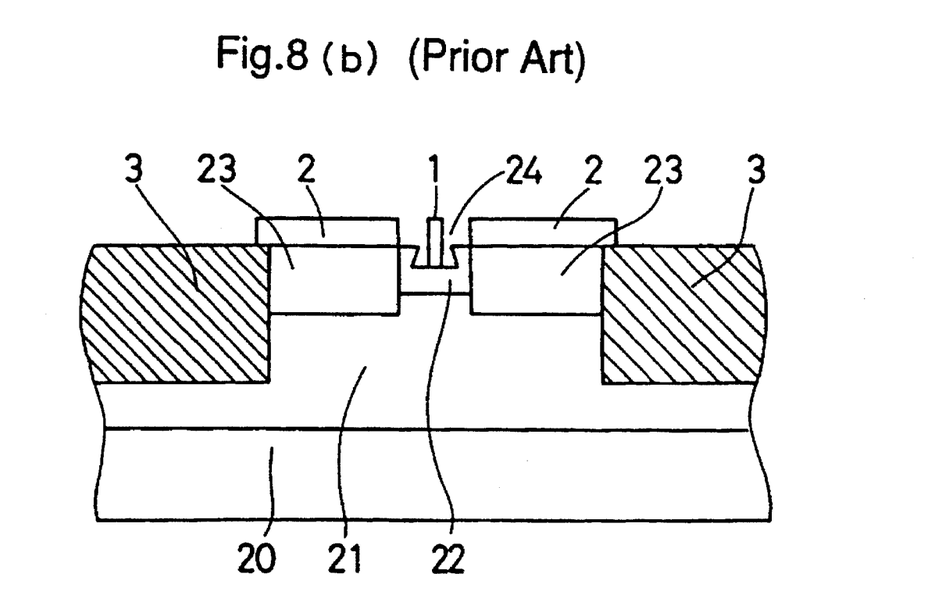

FIGS. 8(a) and 8(b) are diagrams illustrating a prior art compound semiconductor device where FIG. 8(a) is a plan view showing a device structure of GaAs system MESFET and FIG. 8(b) is a cross-sectional view in line E-E' of FIG. 8(a). In the figures, reference numeral 20 designates a GaAs substrate. A GaAs buffer layer 21 is disposed on the GaAs substrate 20. A low concentration n⁻ type GaAs semiconductor layer 22 serving as a channel layer is produced by ion implantation on the buffer layer 21. High concentration n⁺ type GaAs semiconductor layers 23 are produced by ion implantation at source and drain regions at both sides of the channel layer 22. A recess 24 is produced at a prescribed portion of the channel layer 22. A gate electrode 1 is disposed on the recess 24 to provide a Schottky junction. A first ion implantation region 3 as an insulating region for element separation is produced by ion implantation employing H or the like as ion source at the entire contour of the periphery of the device region. Ohmic electrodes 2 of source and drain are produced on the device region and a part of the insulating region. Here, the fat line in FIG. 8(a) shows a boundary of the metal electrodes.

The production method and the function of the device will be described.

An n⁻ type GaAs semiconductor layer 22 of low impurity concentration of above $1 \times 10^{17}$ cm⁻³ which serves as a channel layer is produced by impurity implantation on the buffer layer 21 of impurity concentration of below $1 \times 10^{16}$ cm⁻³ produced on a GaAs semiconductor substrate 20, and at the source and drain production regions sandwiching the gate production region in the n⁻ type GaAs semiconductor layer 22 which serves as the channel layer, source and drain regions comprising n⁺ type GaAs semiconductor layer 23 of high concentration of above $3 \times 10^{17}$ cm⁻³ are produced by impurity implantation. Thereafter, insulation implantation is carried out into the entire crystal growth layers 21 and 22 containing carriers therein at the periphery of the transistor using photoresist (not shown) as a mask, thereby first ion implantation regions 3 are produced to perform element separation. Thereafter, a source and a drain electrodes 2 are produced on the n⁺ type GaAs semiconductor layer 23 at once, and a portion of the n⁻ type GaAs semiconductor layer 22 is recess etched to produce a recess 24 with adjusting the device characteristics utilizing variation in saturation current between the source and drain electrodes. Thereafter, a gate electrode 1 is produced so as to have a Schottky junction on the recess 24.

The GaAs system MESFET having the above-described structure functions to operate a transistor operation in which the current $I_{ds}$ between the source and the drain is controlled by the gate voltage applied to the gate electrode 1. In addition, in the GaAs system MESFET, the device isolation is performed by an element separation employing ion implantation.

In the GaAs system MESFET device in which the device isolation is performed by ion implantation as described above, there are problems that variations in the gate junction breakdown voltage, particularly, reductions in the gate breakdown voltage are caused by process variations such as variations in the epitaxial wafer produced dependent on the wafer process and variations in the gate process or the like. In other words, when concentration of electric field occurs, the gate breakdown voltage is dependent on the intensity of the electric field, the way of attachment of the Schottky junction gate electrode, a wafer (bulk) state, and the way of formation of the insulating interface between the insulating layer and the portion of the active layer of the FET, and these vary with the process variations.

Figure 10A:
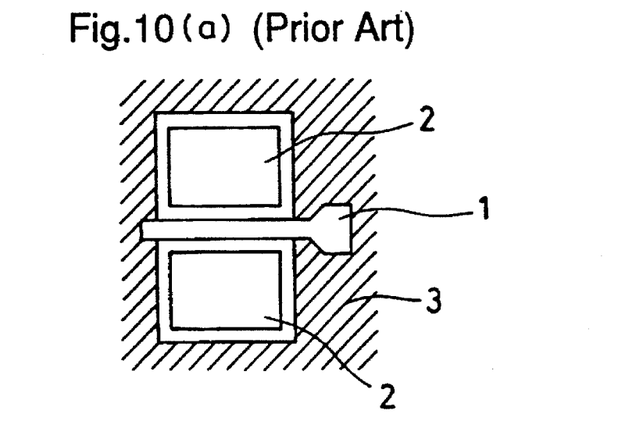
FIGS. 10(a) and 10(b) are diagrams for explaining problems in producing an insulating region by insulating implantation in the prior art GaAs system MESFET.
Figure 10B:
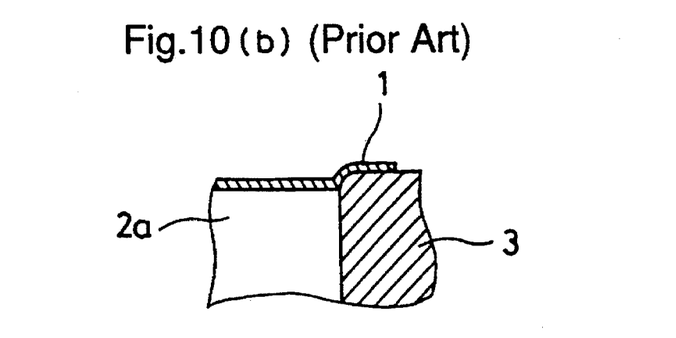

When concentration of electric field occurs at a portion of the insulating interface between the insulating layer and the active layer of the FET dependent on these varying factors, there arises an interface leakage of a current. In a case of recess type gate structure, because the etching rate is different between the insulating region and the active layer portion, a step due to the etching is produced at the interface between the insulating region 3 and the active layer portion 2a as shown in FIG. 10, and when this step is fairly steep, it causes breakage of the gate electrode 1 that is produced thereon and destruction of the gate oxide film. As a result, the gate breakdown voltage is reduced so that gate destruction is likely to arise. Because of such reduction in the gate breakdown voltage, reliability of the device is also reduced.

SUMMARY OF THE INVENTION

It is an object of the present invention to provide an element separating method of a compound semiconductor device that keeps the gate breakdown voltage at a high value and that keeps a high reliability.

It is another object of the present invention to provide a compound semiconductor device that is produced by the above production method.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first embodiment of the present invention, an element separating method for a compound semiconductor device includes, in order to secure a stable resistance of the insulating region, carrying out a first ion implantation into the entire contour of the periphery of the device region, thereby producing the first insulating region so that the maximum ion implantation concentration region functioning as an insulation destruction relaxing layer is located in the buffer layer at the deepest position of the epitaxial growth layers. Thus, even when there is a distribution of implanted ions in the depth direction at the thermal processing in the wafer process, the implanted ions diffuse so that the concentration of ions becomes uniform in the depth direction, and diffusion of ions implanted into the epitaxial layers containing carriers therein is suppressed and a thermally stable ion implantation concentration is obtained, and inter-element leakage current flowing through growth interface between the buffer layer and the layer containing carriers therein is also suppressed. Therefore, stable device characteristics of a compound semiconductor device is obtained and a highly reliable device is obtained. Thus, this provides a highly reliable element separating technique producing a stable insulating characteristic.

According to a second embodiment of the present invention, an element separating method for a compound semiconductor device includes, aiming at that a concentration of electric field at the interface between the gate electrode and the insulating region may not occur even when a voltage is applied to the gate, in addition to producing a first insulating region defining a device region surrounded thereby by the first ion implantation, producing a second insulating region by a second ion implantation, having a resistance different from that of the first insulating region at a desired region of the device periphery. Therefore, electric field concentration at the interface between the gate metal and the insulating region is relaxed thereby preventing electro-static destruction at the gate part. Thereby a stably high gate junction breakdown voltage is secured and further, a simple design for a device is realized. Thus, this further provides a highly reliable element separating technique and a highly reliable device.

According to a third embodiment of the present invention, the second insulating region is produced at portions where either or both of the root part and the end part of the gate electrode and the boundary between the first insulating region and the device periphery region overlap with each other.

According to a fourth embodiment of the present invention, the second insulating region is produced in a prescribed width at the entire contour of the boundary between the first insulating region and the device periphery region.

According to a fifth embodiment of the present invention, either or both of the first and the second insulating region have an isolation destruction relaxing layer having the maximum value of the ion implantation concentration in the buffer layer.

According to a sixth embodiment of the present invention, ion implantation is carried out to produce an insulating region by ion implantation employing a photoresist mask having a periphery portion corresponding to the device periphery, that periphery portion is formed in a diagonal cross section configuration or in a step cross-section configuration comprising, for example, a first photoresist mask and a second photoresist mask of a thickness less than that of the first photoresist mask, and thereby the insulating region produced by the ion implantation has a planar or two-dimensional concentration distribution in the transverse direction. Therefore, electric field concentration at the interface between the gate and the insulating region is relaxed, resulting in a highly reliable element separating technique having a stable insulating property and a highly reliable device.

DETAILED DESCRIPTION OF THE PREFERRED EMBODIMENTS

Embodiment 1

Figure 1:
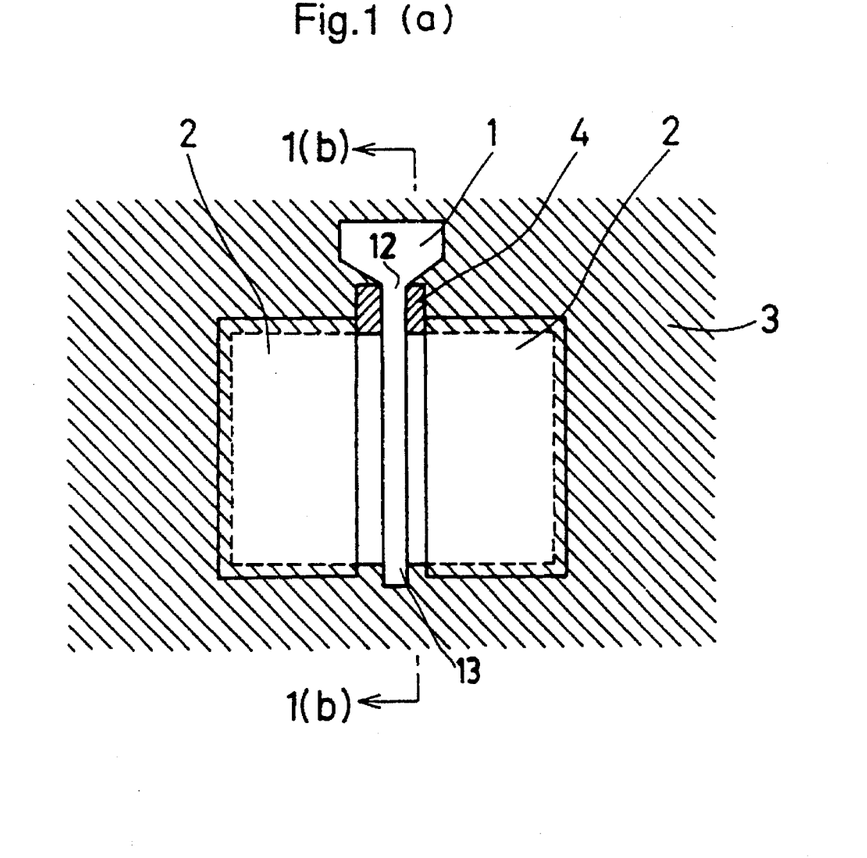
FIGS. 1(a) and 1(b) are respectively a plan view and a cross-sectional view illustrating an element structure of a GaAs system MESFET in accordance with a first embodiment of the present invention.

FIG. 1 shows a GaAs system MESFET according to a first embodiment of the present invention. FIG. 1(a) is a plan view of a device structure of a GaAs system MESFET according to the first embodiment of the present invention, and FIG. 1(b) illustrates a cross-section in line A–A' of FIG. 1(a). The cross-section in line E–E' of FIG. 1(a) is the same as that shown in FIG. 8(b). In the figures, the reference numerals the same as those in FIG. 8 designate the same or corresponding elements. Reference numeral 4 designates a second insulating region produced to have a resistance different from that of the first insulating region 3, at portions where the boundary between the first insulating region 3 and the device periphery region, and the root part of the gate electrode 1 overlap with each other. Here, the resistance of the first ion implantation region 3 is $1 \times 10^7$ $\Omega$cm, and the resistance of the second ion implantation region 4 is $1 \times 10^6$ $\Omega$cm.

The element separating method by ion implantation in the manufacture of the compound semiconductor device of the present invention will be described below.

Figure 9:
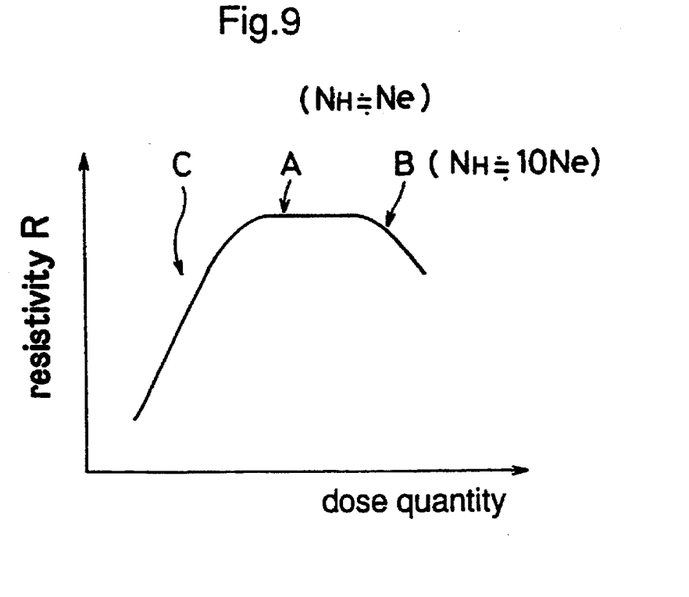
FIG. 9 is a diagram showing a relation between implanted dose quantity and resistance in an element separating method by ion implantation.

When producing an insulting region by ion implanting, i.e., bombarding proton atoms into the semiconductor, the dose quantity and the resistance produced thereby has a relation as shown in FIG. 9. That is, it has three regions, i.e., region C where the resistance increases with the increase of the dose quantity, region A where the resistance is kept flat regardless of the increase of the dose quantity, and region B where the resistance decreases with the increase of the dose quantity.

In the present invention, in order to relax the concentration of electric field between the insulating region and the active layer, a second ion implantation region 4 having a resistance different from that of the first ion implantation region 3 is produced at a part of the rectangular region that is formed between the active regions respectively underlying the source and drain electrodes 2 in the device region surrounded by the first ion implantation region 3, thereby to relax the electric field concentration at the interface region. Here, the first and the second ion implantation regions are produced by the ion implantations of the regions A and B of FIG. 9, respectively, or the ion implantations of the regions B and A of FIG. 9, respectively. Meanwhile, in order to provide a thermally stable device, it is ideal that the first and the second ion implantation regions are produced by the ion implantation of the above-described regions A and B, respectively because the region C is likely to become thermally unstable and unreliable. That a region is thermally unstable and unreliable means that the carrier reactivation in which the insulation is destroyed by heat and the carriers are activated, occurs in a state where the insulation is obtained by the ion implantation. Here, the carrier reactivation time indicating the goodness of the insulation, that is, how many hours the insulation is kept before the carrier reactivation occurs, is larger in the region B than in the region C.

In the graph shown in FIG. 9, when the implanted ion is proton (H), at the region A where $N_H = N_e$ ($N_H$ represents the concentration of proton in the implanted region, and $N_e$ represents the concentration of carrier (electron) in that region), the resistance R is about $10^7$ Ωcm, and at the region B where $N_H \approx 10\ N_e$, the resistance R of the graph decreases with the increase of the dose quantity.

Figure 7:
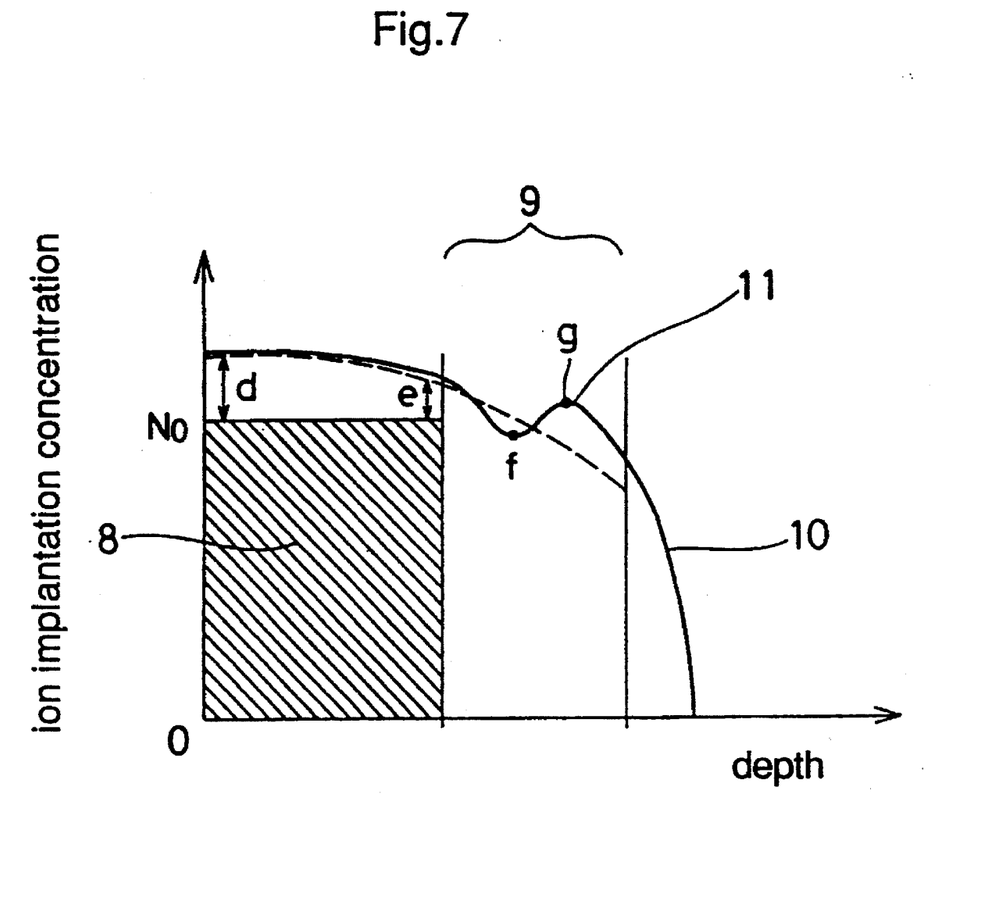
FIG. 7 is a diagram illustrating an ion implantation profile in an element separating method by ion implantation in accordance with the first embodiment of the present invention.

FIG. 7 shows a carrier concentration profile produced by the ion implantation of the present invention. While conventionally ion implantation the quantity of which is shown by a broken line D in the figure is carried out, the ion implantation quantity in this conventional method is quite close to the carrier concentration at the upper end of the carrier profile 8 at the interface between the buffer layer 9 and the semiconductor layer 21 disposed thereon, and therefore the isolation is weak and the carrier reactivation is likely to arise at this interface part. When thermal diffusion is carried out, it is stable at the position close to the device surface of the semiconductor layer 22 because there is a difference d between the ion implantation concentration and the carrier concentration, while at the interface of the buffer layer there is only a difference e therebetween as well as the ion implantation profile at that point has an inclination, whereby the ions are likely to flow to the left or the right (to deeper or shallower). Thereby, the above difference e approaches to almost zero, meaning that the interface of the buffer layer is the weakest against the isolation, thereby causing that the insulation destruction begins at this point. In FIG. 7, the carrier concentration $N_e$ of the channel layer is about $1\ 10^{19}\ cm^{-3}$.

In order to relax this insulation destruction, an isolation destruction relaxing layer having the maximum ion implantation concentration (point g) is provided in the buffer layer in the present invention, whereby the implanted ions at the left side and the right side of the point g in the graph move toward the minimum point f at the left side of the point g in the graph by the thermal diffusion, and on the other hand, the implanted ions in the vicinity of the interface of the buffer layer at the left side of the point f in the graph move toward the right side (toward the point f). Thus, it can be suppressed that the ion concentration at the point having the difference e at the buffer layer interface is reduced and that the isolation is weakened.

The position of the maximum point g is about 2000 to 5000 Å from the buffer layer interface, and the maximum point g is positioned in the buffer layer.

The concentration 10 at the point g having the maximum ion concentration produced in the buffer layer 9 at the deepest position of the epitaxial growth layers, is preferred to be equal to or larger than the carrier concentration of the carrier profile 8 of the active layer.

Heretofore, the ion implantation concentration according to the present invention is not limited to that shown in FIG. 7. The profile may be that the concentration at the point f and the point g are the same and the concentration profile between the two points keeps almost flat. Also in case where such ion implantation concentration profile is employed, the same function and effect of the invention are obtained.

While the implanted hydrogen ions are spread in the depth direction from a position of high proton concentration to a position of the low proton concentration by the thermal diffusion after the ion implantation as described above, if the ion concentration profile is established so that the proton concentration at the position of low hydrogen concentration may not easily fall down, the device becomes thermally stable and the device characteristics themselves are also stabled.

In the present invention:

(1) when only the first insulating region is provided, the above-described ion concentration profile is applied to this first insulating region;

(2) when two insulating implantation regions, i.e., the first and the second, and insulating regions are provided as in the first, the second, and the fifth embodiments, the above-described concentration profile is applied to the first implantation region;

(3) when two insulating implantation regions, i.e., the first and the second insulating regions are provided and the second insulating region is produced to have a prescribed width at the entire periphery of the boundary between the first ion implantation region 3 and the device periphery region as in the fifth embodiment, the above-described concentration profile is applied to the first implantation region;

(4) in order to control the insulation resistance itself, the above-described concentration profile can be applied to both the first and the second insulating regions.

In other words, the first embodiment includes the first ion implantation region 3 having the same plan arrangement as that of the prior art device that is produced having the ion implantation concentration profile 10 shown by the real line in FIG. 7, and the second ion implantation region 4 provided at the root part of the gate, i.e., the feeding point from the gate where the electric field concentration is of the largest. The second ion implantation region 4 may be produced having the ion implantation concentration profile 10 shown by the real line in FIG. 7. But this is not necessarily required.

In the first embodiment, since the first ion implantation region 3 including a layer functioning as an isolation destruction relaxing layer having a peak of the ion implantation profile in the buffer layer is provided, the diffusion of ions implanted into the epitaxial layers containing carriers therein is suppressed and a thermally stable ion implantation concentration is obtained. This can provide a stable insulating characteristic. In addition, the inter-element leakage current flowing through the growth interface between the buffer layer and the layer containing carriers therein is suppressed and a stable device characteristic is obtained, resulting in a highly reliable device.

In addition, because the second ion implantation region 4 having a resistance different from that of the first insulating region 3 is provided in the vicinity of the gate root part at the interface of the first insulating region 3 where the electric field concentration due to the gate is most likely to occur, the electric field concentration at the interface between the gate and the insulating region is relaxed, thereby preventing electro-static destruction at the gate part. Thereby a stable high gate junction breakdown voltage is secured, and also a simple design for a device is realized. These results in a more reliable element separating technique and a more reliable compound semiconductor device.

Embodiment 2

Figure 2:
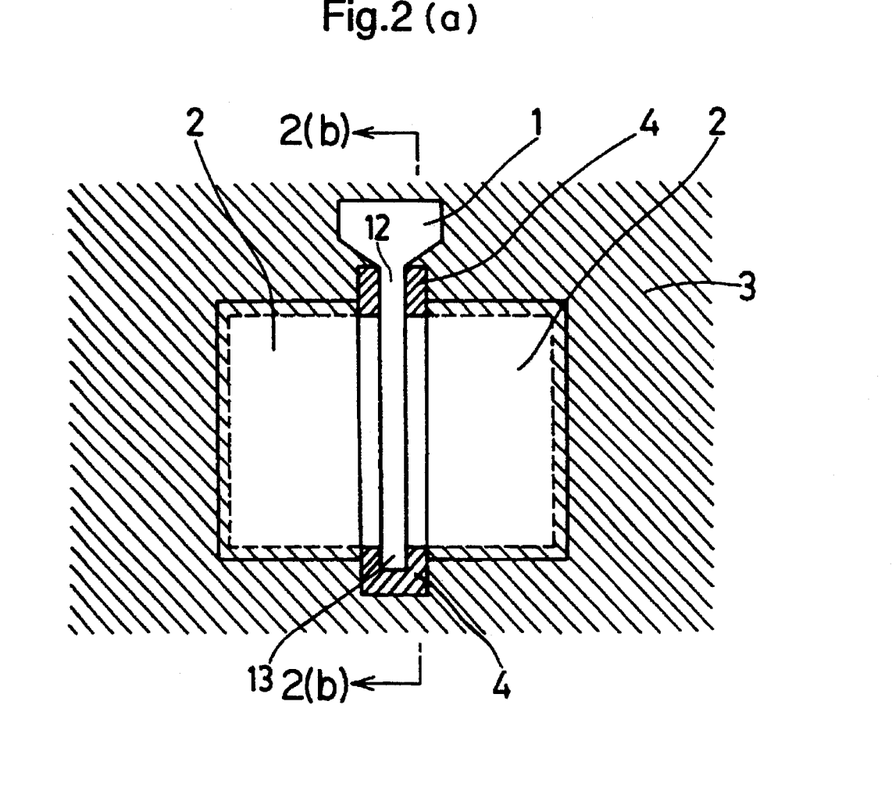
FIGS. 2(a) and 2(b) are respectively a plan view and a cross-sectional view illustrating an element structure of a GaAs system MESFET in accordance with a third embodiment of the present invention.

In a second embodiment of the present invention shown in FIG. 2, second ion implantation regions 4 are produced at portions, where the boundary region between the first ion implantation region 3 as an insulating region and the device periphery region, and the root part of the gate electrode 1 where the electric field concentration is the most likely to occur and further the end part of the gate electrode 1 where the electric field concentration is secondly most likely to occur, overlap with each other. Also in this second embodiment, the first ion implantation region 3 has the ion implantation concentration profile 10 of FIG. 7, and the second ion implantation region 4 is not necessarily required to have the ion implantation concentration profile 10.

In this second embodiment, in addition to the effect of the first embodiment, the effect of relaxing the electric field concentration at the interface between the gate and the insulating region is increased by providing the second ion implantation region 4 also at the end part of the gate electrode, and thus the stable insulating characteristic is further improved. Therefore, a more reliable element separation is performed and a more reliable compound semiconductor device is obtained.

Embodiments 3 and 4

While in the GaAs system MESFET of the above-described first and second embodiments the recess structure 24 is employed for the gate electrode 1, this gate electrode 1 can be of a planar type other than of a recess structure, and these provide a third and a fourth embodiments with the same effects as those in the first and second embodiments.

Embodiment 5

Figure 3A:
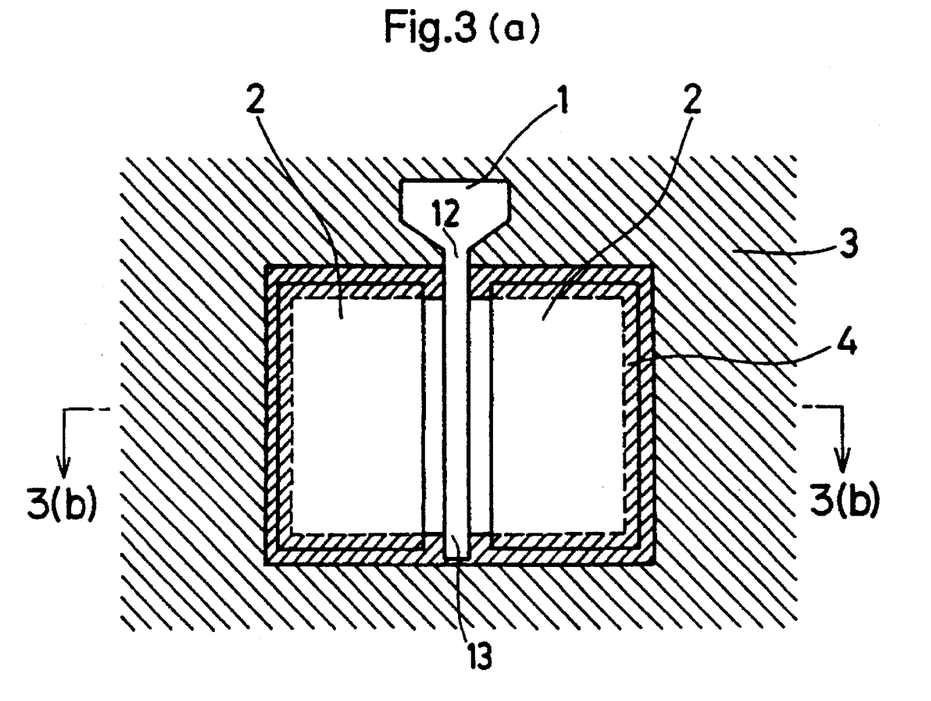
FIGS. 3(a) and 3(b) are respectively a plan view and a cross-sectional view illustrating an element structure of a GaAs system MESFET in accordance with a fifth embodiment of the present invention.
Figure 3B:
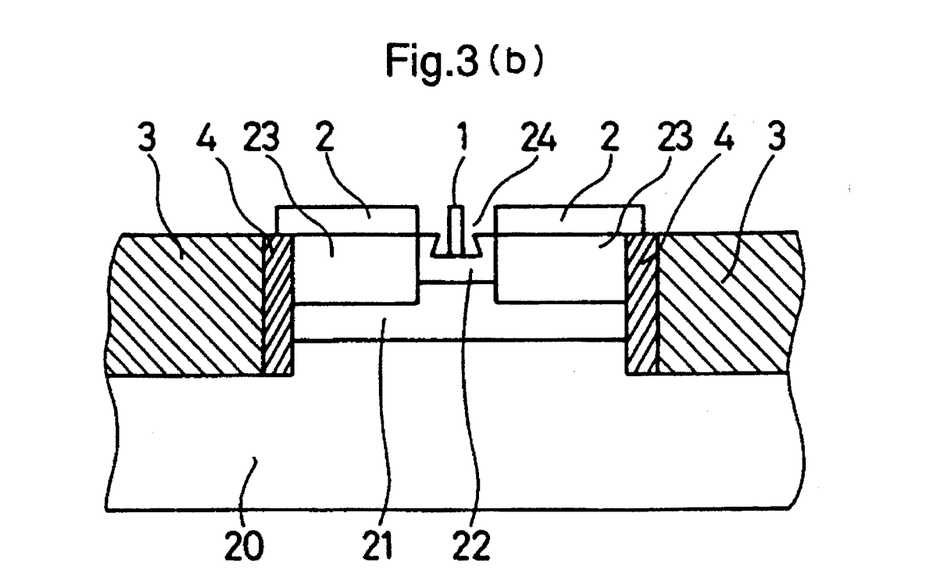

As a fifth embodiment of the present invention shown in FIG. 3, in a GaAs system MESFET having a recess structure, the second ion implantation region 4 is produced in a prescribed width at the entire periphery of the device, i.e., at the boundary region between the first ion implantation region 3 and the device periphery region.

In this fifth embodiment, the first ion implantation region 3 has the ion implantation concentration profile 10 shown in FIG. 7 as in the first and second embodiments. The second ion implantation region 4 is produced in a prescribed width at the entire periphery of the device, i.e., at the boundary between the first ion implantation region 3 and the device periphery region. The second ion implantation region 4, if it has the above-described profile 10, functions more effectively.

In this fifth embodiment, a compound semiconductor device of a recess structure has the first ion implantation region 3 having a layer functioning as an isolation destruction relaxing layer having a peak in its ion implantation profile in the buffer layer, thereby the diffusion of ions implanted into the epitaxial layers containing carriers therein is suppressed and the thermally stable ion implantation concentration is obtained. Therefore, a stable insulating property is obtained and the inter-element leakage current flowing through the growth interface between the layer containing carriers therein and the buffer layer is suppressed, resulting in stable device characteristics and a highly reliable device.

Further, the second ion implantation regions 4 having the resistance different from that of the first insulating region 3 are provided at the entire periphery of the device region including the gate root part and the gate end part among the interface region of the first insulating region 3, where the electric field concentration is most likely to occur, thereby the electric field concentration at the interface between the gate or the like and the insulating region is relaxed, and a stable high gate junction breakdown voltage is secured. Thus, a more reliable device isolating technique and a more reliable device are obtained. Also a simple design for a device is realized.

Embodiment 6

Figure 4:
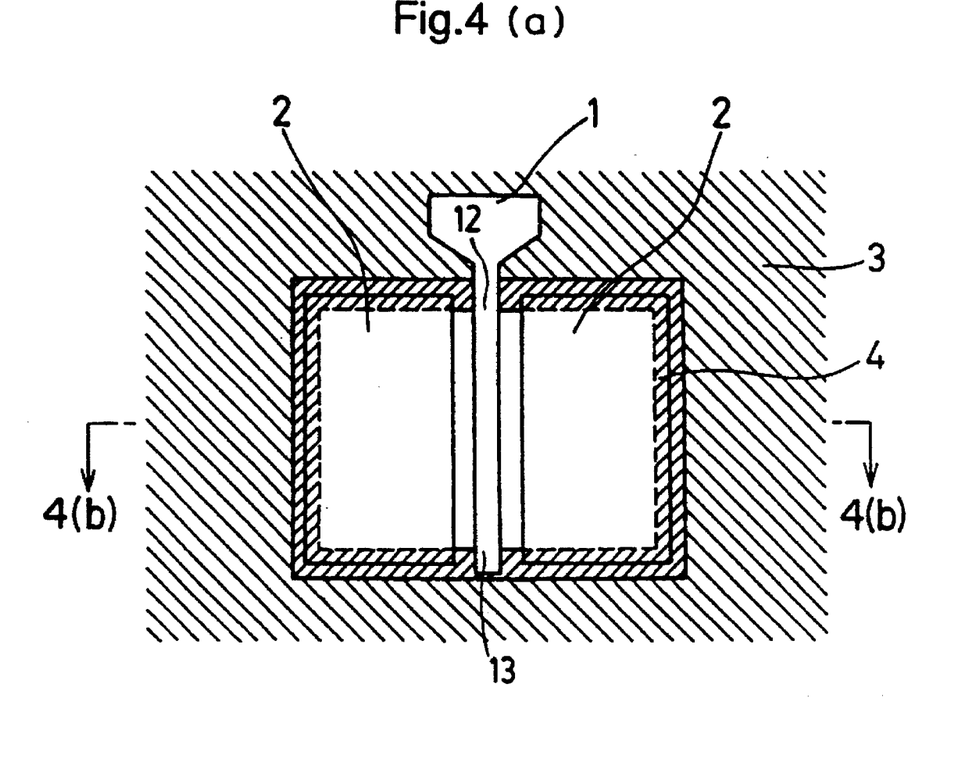
FIGS. 4(a) and 4(b) are respectively a plan view and a cross-sectional view illustrating an element structure of a GaAs system MESFET in accordance with a sixth embodiment of the present invention.

In a sixth embodiment of the present invention shown in FIG. 4, a GaAs system MESFET of a planar type, which is not of a recess structure, has the second ion implantation region 4 of a prescribed width at the entire contour of the boundary between the first ion implantation region 3 and the device periphery region.

Also in this sixth embodiment, the same effects as those in the fifth embodiment are obtained.

Embodiment 7

Figure 5:
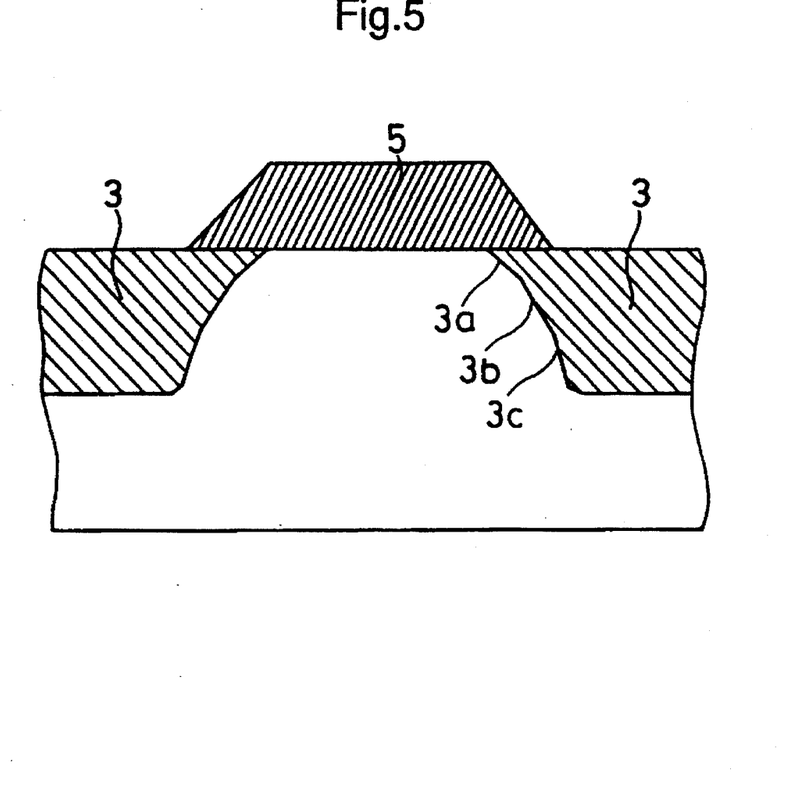
FIG. 5 is a cross-sectional view of a photoresist mask profile showing an element separating method of a GaAs system MESFET by ion implantation in accordance with a seventh embodiment of the present invention.

FIG. 5 shows a seventh embodiment of the present invention. In the figure, reference numeral 3 designates an ion implantation region as an insulating region for separating an element. A photoresist mask 5 having a peripheral part of a diagonal cross section configuration is used as a mask for the first ion implantation. Such photoresist mask 5 is obtained produced by performing photolithography to photoresist and thermally reflowing the same.

The function will be described.

In FIG. 5, if generally the photoresist has a vertical surface at its periphery, there arises a pinpoint electric field concentration that the electric field is concentrated at the contact point of the photoresist with the insulating region, which is a semiconductor layer before ion implantation is performed. In this seventh embodiment, however, because the side surface of the photoresist is formed of a diagonal cross section configuration, the insulating region 3 produced in the semiconductor layer has sloped portions 3a, 3b, and 3c at its side surface as shown in the figure, and therefore, the pinpoint electric field concentration at these portions are turned into a linear concentration or a planar (or two-dimensional) concentration of electric field, and its electric field concentration is relaxed more largely than in a case where the insulating interface has a vertical surface configuration. Therefore, the electric field concentration at the interface between the gate or the like and the insulating region is relaxed, thereby a stable insulating characteristic is obtained. Thus, a more reliable element separating technique and a more reliable device are obtained.

Embodiment 8

The above-described seventh embodiment can be realized also in a recess structure FET as shown in FIG. 3(b), and this provides an eighth embodiment.

Embodiment 9

Figure 6:
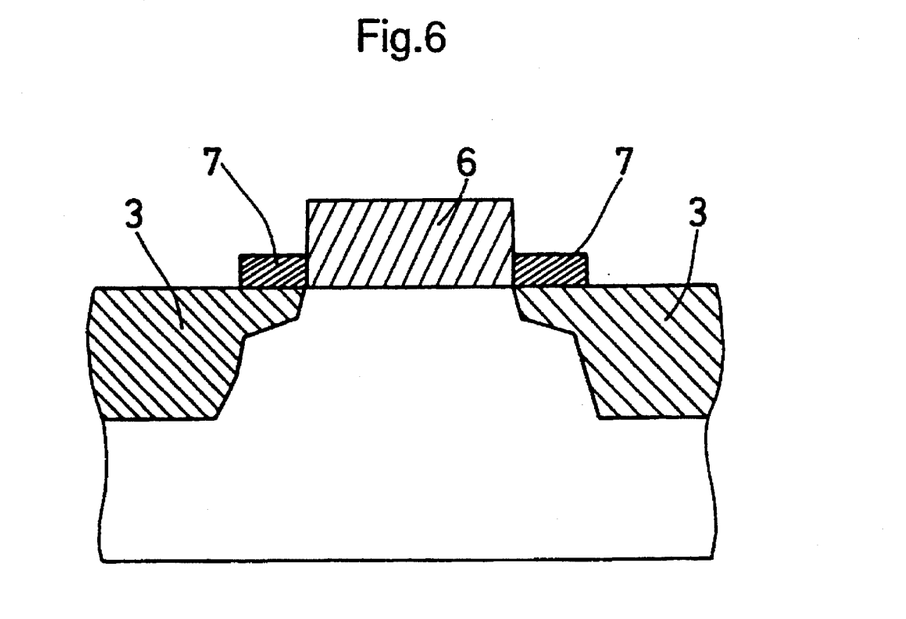
FIG. 6 is a cross-sectional view of a photoresist mask profile showing an element separating method of a GaAs system MESFET by ion implantation in accordance with a ninth embodiment of the present invention.

FIG. 6 shows a ninth embodiment of the present invention. In the figure, reference numeral 3 designates an ion implantation region for separating an element. A first photoresist mask 6 is used for ion implantation. A second photoresist mask 7 having a thickness less than that of the first photoresist mask is disposed at the periphery of the first photoresist mask 6.

The operation and the function will be described.

In the seventh embodiment, the side surfaces of the photoresist are formed in a diagonal cross section configuration, thereby a planar or two-dimensional concentration distribution of the electric field in the transverse direction is produced in the insulating region. In this ninth embodiment, this is realized by employing two photoresists. More particularly, the second photoresist 7 of a thickness less than that of the first photoresist 6 is provided at the sides of the first photoresist 6, and proton bombardment is carried out using the second photoresist 7 as a mask, thereby an insulating implantation region 3 shown in FIG. 6 is obtained. This provides a two-dimensional concentration distribution of electric field in all directions in the transverse direction. In this embodiment, photolithography for producing the photoresist is required to be carried out two times, complicating the process a little, but the pinpoint electric field concentration at the interface of the insulating region can be greatly relaxed by being turned into a linear or one-dimensional concentration or a planar or two-dimensional concentration similarly as in the seventh embodiment, thereby electric field concentration at the interface between the gate or the like and the insulating region is relaxed as in the seventh embodiment. Thus, a more reliable element separating technique and a more reliable device having a stable insulating property are obtained.

Embodiment 10

The above-described ninth embodiment can be realized also in a recess structure FET as shown in FIG. 3(b), and this provides a tenth embodiment.

In the above-described embodiments, a GaAs system MESFET is described, but the present invention can be also realized in a semiconductor device comprising other materials, and the same effects as those described above are obtained.

In the above-described embodiments, as ion implanted to produce an insulating region, proton (hydrogen) (H) is mainly used, but as ion to be implanted, one or more kinds of ions selected among hydrogen (H), boron (B), and oxygen (O) can be employed with the same effects as those described above.

What is claimed is:

1. A compound semiconductor device structure including element isolation comprising:

a compound semiconductor substrate including a device region having a periphery;

a semiconductor device disposed partially in the device region;

a first ion implanted insulating region of the compound semiconductor substrate located at the entire periphery of the device region; and a second ion implanted insulating region of the compound semiconductor substrate located at a boundary between the periphery of the device region and the first insulating region and having a resistivity different from that of the first insulating region.

2. The compound semiconductor device structure of claim 1 wherein the resistivity of the first insulating region is larger than the resistivity of the second insulating region.

3. The compound semiconductor device structure of claim 1 wherein the second insulating region is located at said boundary and along all of the periphery of the device region.

4. The compound semiconductor device structure of claim 3 wherein the semiconductor device is a field effect transistor including a gate electrode extending across the device region, the gate electrode including a wider contacting portion adjacent a root part of the gate electrode and located outside of and at a first side of the device region, and a distal end located outside of and at a second side of the device region opposite the first side of the device region, the root part and the distal end being disposed on the second insulating region.

5. The compound semiconductor device structure of claim 4 wherein the compound semiconductor substrate includes a recess in the device region, the gate electrode being disposed within the recess.

6. The compound semiconductor device structure of claim 1 wherein the semiconductor device is a field effect transistor including a gate electrode extending across the device region, the gate electrode including a wider contacting portion adjacent a root part of the gate electrode and located outside of and at a first side of the device region, and a distal end located outside of and at a second side of the device region opposite the first side of the device region.

7. The compound semiconductor device structure of claim 6 wherein the second insulating region is located adjacent the root part of the gate electrode.

8. The compound semiconductor device structure of claim 6 wherein the second insulating region includes a first part located adjacent the root part of the gate electrode and a second part located adjacent the distal end of the gate electrode.

* * * * *